(12) United States Patent
Ishikawa

(10) Patent No.: US 7,852,164 B2
(45) Date of Patent: Dec. 14, 2010

(54) PIEZOELECTRIC OSCILLATOR

(75) Inventor: Masayuki Ishikawa, Ebina (JP)

(73) Assignee: Epson Toyocom Corporation (JP)

( * ) Notice: Subject to any disclaimer, the term of this patent is extended or adjusted under 35 U.S.C. 154(b) by 115 days.

(21) Appl. No.: 12/268,490

(22) Filed: Nov. 11, 2008

(65) Prior Publication Data

US 2009/0121799 A1    May 14, 2009

(30) Foreign Application Priority Data

Nov. 12, 2007  (JP) .............................. 2007-292859

(51) Int. Cl.
*H03B 5/36* (2006.01)
(52) U.S. Cl. .................... 331/116 R; 331/160
(58) Field of Classification Search .................. 331/160, 331/185
See application file for complete search history.

(56) References Cited

U.S. PATENT DOCUMENTS 6,337,604 B1 *  1/2002  Clarke ..................... 331/116 R
6,946,923 B2 *  9/2005  Knickerbocker et al. ..... 331/160
2006/0244546 A1 * 11/2006  Yamamoto .................. 331/158
2006/0267704 A1 * 11/2006  Stevenson et al. ........... 331/185

FOREIGN PATENT DOCUMENTS

JP    10-135741    5/1998
JP    2006-121134  5/2006

* cited by examiner

*Primary Examiner*—Joseph Chang
(74) *Attorney, Agent, or Firm*—Harness, Dickey & Pierce, P.L.C.

(57) ABSTRACT

A piezoelectric oscillator includes: a piezoelectric resonator; an oscillation circuit including a variable resistance circuit and a transistor for oscillation; a constant current circuit, the constant current circuit including a first current mirror circuit, and a current control circuit having an output terminal and controlling a current flowing in the first current circuit so as to enable an output current of the constant current circuit to be adjusted, the output terminal of the first current mirror circuit being coupled to at least one of a collector and a base of the transistor for oscillation with the variable resistance circuit; and a control circuit coupled to the current control circuit and the variable resistance circuit, the control circuit controlling the current control circuit and a resistance value of the variable resistance circuit.

8 Claims, 7 Drawing Sheets

PIEZOELECTRIC OSCILLATOR

BACKGROUND

1. Technical Field

The present invention relates to a piezoelectric oscillator, and particularly to a piezoelectric oscillator in which a driving current and a collector potential of an oscillation circuit are controlled based on an oscillation frequency of the piezoelectric oscillator and constants of a piezoelectric resonator.

2. Related Art

In recent years, a piezoelectric oscillator is used in many fields from communication device such as cellular phones to commercial-off-the-shelf devices such as a quartz-crystal clock due to its high frequency stability, compact size and lightweight, low cost, and the like. Among them, a temperature compensated piezoelectric oscillator (TCXO) compensating a frequency temperature characteristic of a piezoelectric resonator is widely used in cellular phones and the like that require frequency stability. JP-A-10-135741 discloses an oscillation circuit including a timer 51, a switch portion 52, a current supply portion 53, an oscillation portion 54, a changeover circuit 55, and a buffer portion 56 as shown in FIG. 6. The timer 51 measures an elapsed time from the time at which a power source potential is applied by turning on a power source, and outputs the measurement results when the elapsed time reaches a predetermined time. The switch portion 52 controls on/off between predetermined nodes based on a signal from the timer 51. The current supply portion 53 includes a current mirror circuit in which an output current flows through a constant current source. This current is set to a minimum value by which the oscillation portion 54 maintains the oscillation.

In the oscillation portion 54, one end of a piezoelectric resonator is connected to an output side of an inverter while the other end of the piezoelectric resonator is connected to an input side of the inverter. A feedback resister is connected in parallel with the piezoelectric resonator. The feedback resistor and the piezoelectric resonator form a positive feedback circuit. One end of a first capacitor is connected to the input side of the inverter and the other end of the first capacitor is grounded while one end of a second capacitor is connected to the output side of the inverter and the other end the second capacitor is grounded. Both capacitors stabilize the oscillation. The changeover circuit 55 is turned on when a signal S17 applied to a gate is "H", so that a drain of an NMOS is grounded. As a result, the output of an oscillation signal to a subsequent stage is cut. In contrast, when the signal S17 is "L", the NMOS is turned off. As a result, the oscillation signal is outputted to the subsequent stage. The buffer portion 56 has a function to shape a waveform and output an oscillation signal having a predetermined level.

JP-A-10-135741 discloses that, in the oscillation circuit structured as above, a starting-up time of oscillation can be shortened since the circuit is driven by a large power source current during a predetermined elapsed time from turning on the power source. In addition, the oscillation can be maintained with low power consumption since the oscillation circuit is driven by a small power source current after the predetermined elapsed time.

The oscillation circuit disclosed in JP-A-10-13574, however, does not solve problems facing a case in which a piezoelectric oscillator capable for covering a wide range of frequencies is structured by using a single IC circuit. Because the oscillation circuit is driven by a large current in an initial stage and is driven by a small current after the predetermined elapsed time in order to shorten the starting-up time of the oscillation. Demands for downsizing piezoelectric oscillators and reducing the costs have been increased drastically in recent years. To cope with the demands, oscillation circuits have been fabricated as integrated circuits. Fabricating an oscillation circuit as an IC requires high initial costs, leading to a problem in that costs per oscillator can be reduced by only mass production. To reduced the costs, a requirement arises that the IC is used in a wide range of frequencies, i.e., from 10 Mhz to 50 Mhz. This requirement requires that the piezoelectric resonator is downsized while increasing the frequency range, resulting in an effective resistance of the piezoelectric resonator being increased and frequency dips being produced. Improving the effective resistance and suppressing the frequency dips widen the values of constants such as the capacitance ratio of a piezoelectric resonator, and arise a problem in that a negative resistance does not satisfy a design value when an oscillator for a wide range of frequencies is made by using a single IC, or the oscillation is unstable or stopped by temperature change and the like even though the oscillator oscillates.

SUMMARY

An advantage of the invention is to provide a piezoelectric oscillator for a wide range of frequencies by using a single IC.

A piezoelectric oscillator of the invention includes: a piezoelectric resonator; an oscillation circuit including a variable resistance circuit and a transistor for oscillation; and a constant current circuit, the constant current circuit including a first current mirror circuit, a current control circuit having an output terminal and controlling a current flowing in the first current circuit so as to enable an output current of the constant current circuit to be adjusted, the output terminal of the first current mirror circuit being coupled to at least one of a collector and a base of the transistor for oscillation with the variable resistance circuit; and a control circuit coupled to the current control circuit and the variable resistance circuit, the control circuit controlling the current control circuit and a resistance value of the variable resistance circuit.

The piezoelectric oscillator has an advantage that a single IC can be applied to a wide range of frequencies. Because the collector potential of the transistor of the oscillation circuit can be set an adequate potential by controlling the output current of the constant current circuit based on the signal from the output portion of the memory circuit, resulting in the negative resistance of the oscillation circuit being adequately set over a wide range of temperatures.

In the piezoelectric oscillator, the piezoelectric oscillator may further include a switch circuit may be provided in a path through which a collector current of each of the plurality of transistors flows to the control circuit. The constant current circuit may include the current control circuit, the first current mirror circuit, and a constant current source. The current control circuit may be a second current mirror circuit including a first transistor receiving an output current of the constant current source, and a plurality of transistors coupling to the first transistor as a current mirror connection. The plurality of transistors may be coupled parallel each other and coupled to the first current mirror circuit.

The piezoelectric oscillator has an advantage that a single IC can be applied to a wide range of frequencies. Because the collector potential of the transistor included in the oscillation circuit can be set an adequate potential by controlling the output current of the constant current circuit based on the signal from the output portion of the memory circuit corresponding to a frequency requested from a customer, enabling the negative resistance of the oscillation circuit being adequately set over a wide range of temperatures.

In the piezoelectric oscillator, the oscillation circuit may be a Pierce oscillation circuit.

The piezoelectric oscillator using the Pierce oscillation circuit has an advantage that the frequency range is widen and the noise characteristics are improved.

In the piezoelectric oscillator, the oscillation circuit may be a Colpitts oscillation circuit.

The piezoelectric oscillator using the Colpitts oscillation circuit has an advantage that the oscillator can be widely used since the Colpitts oscillation circuit is one of the most frequently used circuits.

In the piezoelectric oscillator, the variable resistance circuit may include a plurality of parallel-connected circuits coupled in series, each of the plurality of parallel-connected circuits having a resistor and a switch that are coupled parallel.

The piezoelectric oscillator has an effect that the collector potential of the transistor of the oscillation circuit can be set as an adequate potential by varying the resistance value of the variable resistance circuit with the switches turned on/off by the signals from the output portion of the memory circuit.

In the piezoelectric oscillator, the variable resistance circuit may include a plurality of series-connected circuits coupled parallel, each of the plurality of series-connected circuits having a resistor and a switch that are coupled in series.

The piezoelectric oscillator has an effect that the collector potential of the transistor of the oscillation circuit can be set as an adequate potential by varying the resistance value of the variable resistance circuit with the switches turned on/off by the signals from the output portion of the memory circuit.

In the piezoelectric oscillator, the path may include a plurality of paths, and the switch circuit may include a plurality of circuits each having a resistor and a switch coupled in series with the resistor, each of the plurality of circuits coupling to one of the plurality of paths.

The piezoelectric oscillator has an effect that the output current of the constant current circuit can be set as an adequate value by turning on/off the switches of the second variable resistance circuit by signals from the output portion of the memory circuit.

In the piezoelectric oscillator, a circuit portion included in the piezoelectric oscillator may be fabricated as an integrated circuit, the circuit portion including the circuits and excluding the piezoelectric resonator.

Since the circuits excluding the piezoelectric resonator are fabricated in the integrated circuit, it makes possible to downsize the piezoelectric oscillator, and further more there is an effect that the output current of the constant current circuit and the collector potential of the transistor of the oscillation circuit can be adequately set by an automatic apparatus operated by computer control. In addition, the IC circuit is used for piezoelectric oscillators for a wide range of frequencies, lowering the cost of the IC. As a result, there is an effect that the cost of the piezoelectric oscillator can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
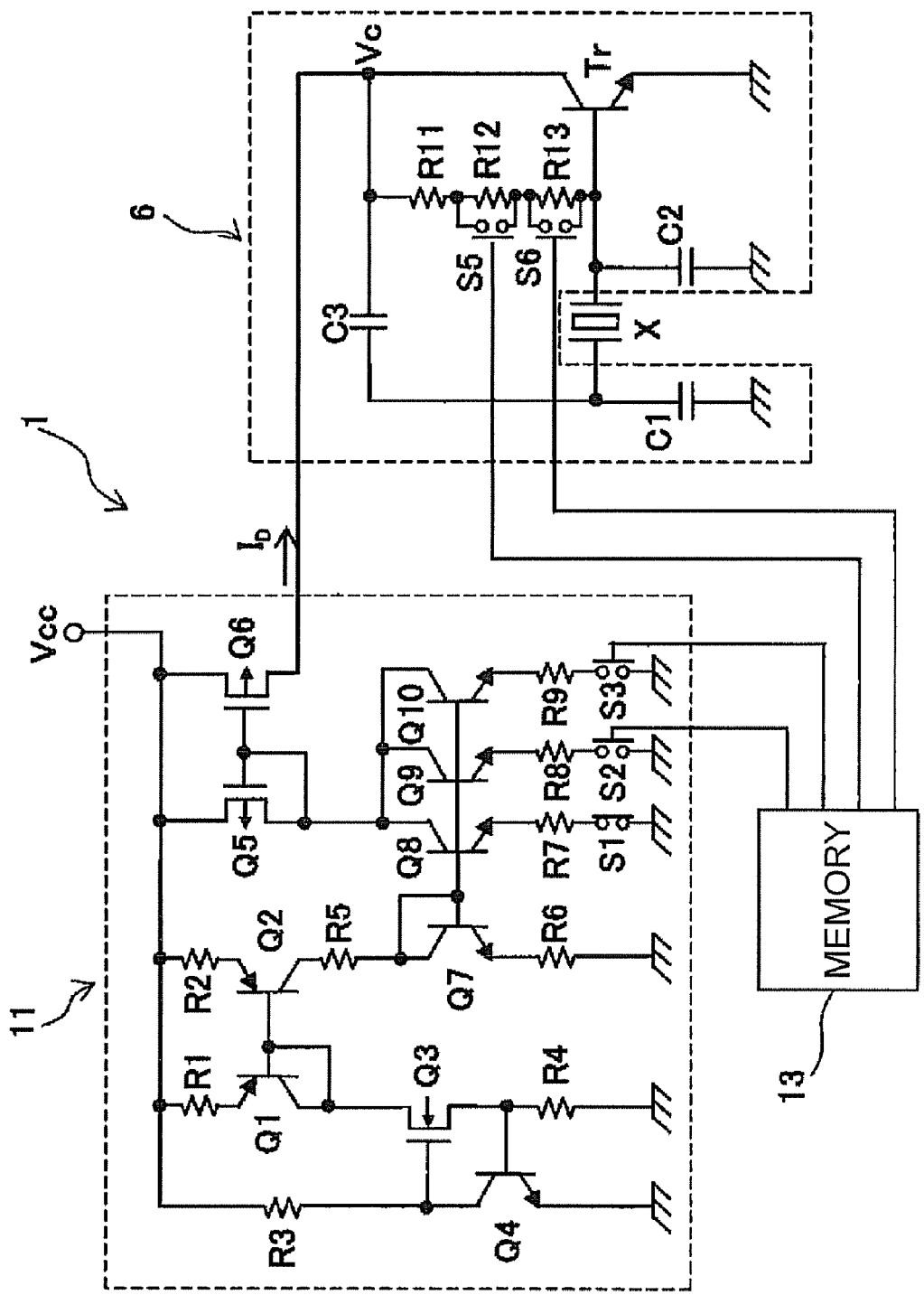
FIG. 1 is a circuit diagram illustrating a structure of a piezoelectric oscillator according to a first embodiment of the invention.

Embodiments of the invention are described with reference to the accompanying drawings. FIG. 1 is a circuit diagram illustrating a structure of a piezoelectric oscillator according to a first embodiment of the invention. A piezoelectric oscillator 1 includes a piezoelectric resonator X, an oscillation circuit 6, a constant current circuit 11, and a memory circuit 13 serving as a control circuit. The oscillation circuit 6 shown in FIG. 1 is a Pierce oscillation circuit. The oscillation circuit 6 is constructed as follows. The emitter of a transistor Tr for oscillation is grounded, and the collector of the transistor Tr is connected to the constant current circuit 11. One terminal of the piezoelectric resonator X is connected to the base of the transistor Tr, and the other terminal of the piezoelectric resonator X is connected to one terminal of a capacitor C1. The other terminal of the capacitor C1 is grounded. A capacitor C2 is connected between the base of the transistor Tr and the ground. One terminal of a capacitor C3 is connected to a node of the capacitor C1 and the piezoelectric resonator X, and the other terminal of the capacitor C3 is connected to the collector of the transistor Tr. In addition, a first variable resistance circuit that determines a collector potential of the transistor Tr is connected between the collector and the base of the transistor Tr. As shown in FIG. 1, an example of the first variable resistance circuit is composed of a resistor R11, a parallel circuit of a resistor R12 and a switch S5, and a parallel circuit of a resistor R13 and a switch S6. The two parallel circuits are connected in series. The switches S5 and S6 are connected to an output portion of the memory circuit 13 with respective signal lines.

The collector potential of the transistor Tr can be controlled by turning on/off the switches S5 and S6 included in the first variable resistance circuit connected between the collector and the base of the transistor Tr based on signals from the output portion of the memory circuit 13. When the switches S5 and S6 are turned off, a current $I_D$ supplied from the constant current circuit 11 with a constant value to the oscillation circuit 6 is represented by the following equations. $I_D=I_A+I_B$ where $I_A$ is a current flows in the resistor 11, and $I_B$ is the collector current of the transistor Tr. In addition, $I_B=h_{FE} \times I_A$ where $h_{FE}$ is a direct current amplification factor of the transistor Tr. Therefore, the voltage between the collector and the base of the transistor Tr is represented by $R11 \times I_D/(1+h_{FE})$. In contrast, when the switches S5 and S6 are turned off, the voltage between the collector and the base of the transistor Tr is represented by $(R11+R12+R13) \times I_D (1+h_{FE})$. Additionally, the current $I_D$ outputted from the constant current circuit 11 can be varied as described later. Thus, a collector potential Vc can be controlled by controlling the voltage between the collector and the base of the transistor Tr. Further, the current $I_D$ outputted from the constant current circuit 11 can be set such that the oscillation circuit has an adequate negative resistance based on the oscillation frequency, an equivalent series resistance value, the capacitance ratio, and the like of the piezoelectric resonator X. Here, the equivalent series resistance value is a resistance value when the phase between two terminals of the piezoelectric resonator shows zero degrees. The capacitance ratio is the ratio of a static capacitance to a motional capacitance.

The constant current circuit 11 shown in FIG. 1 is an example and structured as follows. The constant current circuit 11 includes a constant current source, a current mirror circuit composed of transistors Q5 and Q6 (both are P-channel MOS-FETs) and a current mirror circuit (current control circuit). The constant current source includes: a circuit composed of a resistor R3, a transistor Q3 (N-channel MOS-FET), a transistor Q4, and a resistor R4; and a current mirror circuit composed of transistors Q1 and Q2, and resistors R1 and R2. The current mirror circuit (current control circuit) includes transistors Q7, Q8, Q9, and Q10, resistors R6, R7, R8, and R9, and switches S1, S2, and S3. One terminal of the resistor R3 is connected to a power source voltage Vcc, and the other terminal of the resistor R3 is connected to the gate of the transistor Q3 and the collector of the transistor Q4. The emitter of the transistor Q4 is grounded and the base of the transistor Q4 is grounded with the resistor R4 interposed therebetween. The base of the transistor Q4 and the source of the transistor Q3 are connected. The drain of the transistor Q3 and the collector of the transistor Q1 are connected.

The base and the collector of the transistor Q1 are shorted. The emitter of the transistor Q1 is connected to the power source voltage Vcc with the resistor R1 interposed therebetween while the emitter of the transistor Q2 is connected to the power source voltage Vcc with the resistor R2 interposed therebetween. The collector of the transistor Q2 is connected to the collector of the transistor Q7 with the resistor R5 interposed therebetween. The base and the collector of the transistor Q7 are shorted. The emitter of the transistor Q7 is grounded with the resistor R6 interposed therebetween. The transistors Q8, Q9, and Q10 are connected parallel. Each collector of the transistors Q8, Q9, and Q10 is connected to the drain of the transistor Q5. The bases of the transistors Q7, Q8, Q9, and Q10 are connected. A series circuit (switch circuit) of the resistor R7 and the switch S1 is connected between the emitter of the transistor Q8 and the ground, a series circuit (switch circuit) of the resistor R8 and the switch S2 is connected between the emitter of the transistor Q9 and the ground, and a series circuit (switch circuit) of the resistor R9 and the switch S3 is connected between the emitter of the transistor Q10 and the ground. Additionally, a second variable resistance circuit is composed of the resistors R7 to R9 and the switches S1 to S3. Further, the gate and the drain of the transistor Q5 are shorted. Each source of the transistors Q5 and Q6 is connected to the power source voltage Vcc so as to take out the current $I_D$ from the drain of the transistor Q6 as an output current. The switches S2 and S3 of the constant current circuit 11 are connected to the output portion of the memory circuit 13 with respective signal lines. Here, the switch S1 of the constant current circuit 11 may be connected to the output portion of the memory circuit 13.

The switch S1 is always turned on, and the switches S2 and S3 are turned on/off by signals from the memory circuit 13 so as to vary the current $I_D$ outputted from the P-channel MOS-FET Q6. The current $I_D$ outputted from the transistor Q6 can be finely controlled by increasing the number of transistors and switches included in the current mirror circuit composed of the transistors Q7, Q8, Q9, and Q10. In addition, currents flow in the transistors Q8, Q9, and Q10 can be increased or decreased by changing the size of elements on semiconductors included in the transistors Q8, Q9, and Q10. For example, ratios between each emitter current of the transistors Q8, Q9, and Q10 can be set as 1:1:1 when each of the transistors Q8, Q9, and Q10 has elements of the same size. The ratios also can be set as 1:2:4 when each of the transistors Q8, Q9, and Q10 has elements of a different size.

The current mirror circuit used in the constant current circuit 11 is described with reference to FIG. 7A. A transistor Qa to which an input current $I_1$ is applied is structured as follows: the base and the collector are connected as a diode connection, and the collector voltage is applied to the base of a transistor Qb. An emitter current $I_{E1}$ of the transistor Qa is the sum of a collector current $I_{C1}$ and a base current $I_{B1}$, i.e., $I_{E1}=I_{C1}+I_{B1}$. The input current $I_1$ is the sum of $I_{C1}$, $I_{B1}$, and a base current $I_{B2}$ of the transistor Qb. $I_1$ is also the sum of $I_{E1}$ and $I_{B1}$. If the transistors Qa and Qb have the same characteristics, the emitter current $I_{E1}$ of the transistor Qa is equal to the emitter current $I_{E2}$ of the transistor Qb. However, $I_{E1}$ is smaller than $I_1$ by $I_{B2}$ because the input current $I_1$ is divided into the base current $I_{B1}$ and the base current $I_{B2}$. That is, the input current $I_1$ and the output current $I_2$ satisfy the relation of $1_1-I_2=2I_{B2}$. Thus, in order to make the value of the input current $I_1$ closer to that of the output current $I_2$, the transistor Qb is preferably has a high $h_{FE}$.

Figure 7A:
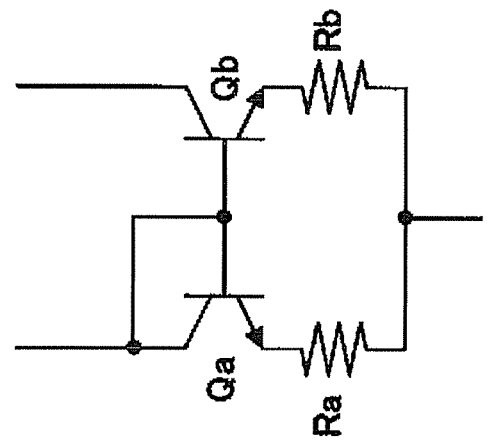
FIGS. 7A, 7B, 7C, and 7D are explanatory views each illustrating a basic structure of a current mirror circuit.
Figure 7B:
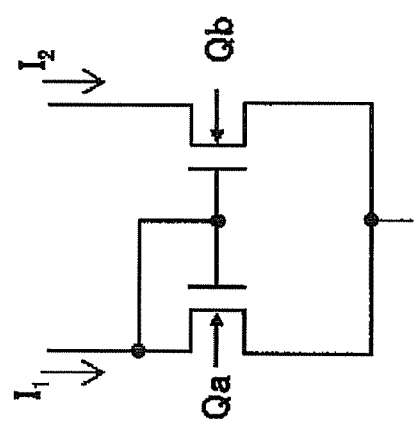
Figure 7C:
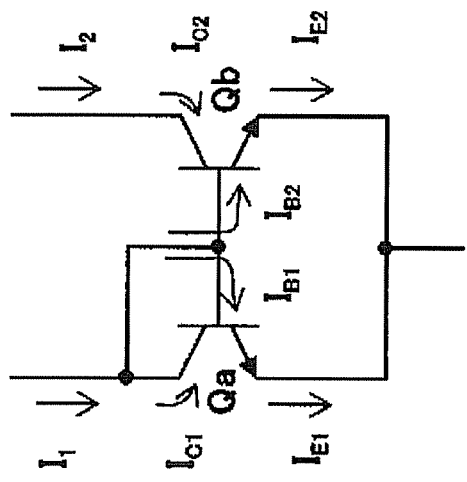
Figure 7D:
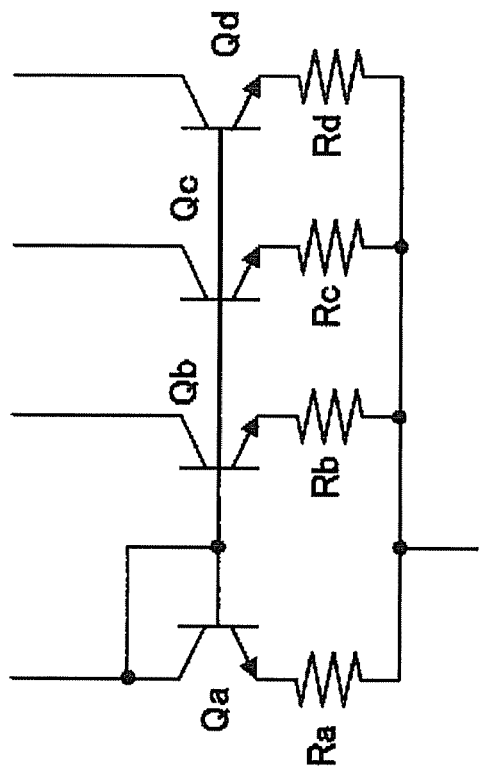

FIG. 7B is a circuit diagram illustrating a current mirror circuit having a higher accuracy and stability than that shown in FIG. 7A by adding resistors. The circuit shown in FIG. 7B has a resistor Ra added to the emitter of the transistor Qa and a resistor Rb added to the emitter of the transistor Qb. FIG. 7C shows a current mirror circuit of a multiple output type that has a plurality of outputs. FIG. 7D shows an example in which MOS-FETs are used instead of the bipolar transistors Qa and Qb shown in FIG. 7A. The circuit shown in FIG. 7D dissolves the setbacks of bipolar transistors, resulting in an ideal relation of the input current $I_1$ and the output current 12, i.e., $I_1=I_2$, being achieved.

The operation of the constant current circuit 11 is described. A current flows from the power source voltage Vcc through the resistor R3 so as to apply a voltage to the gate of the transistor Q3 and the collector of the transistor Q4. The drain current of the transistor Q3 is determined by the voltage between the gate and source of the transistor Q3. Thus, a constant current flows through the transistors Q1 and Q2 included in the current mirror circuit to the source of the transistor Q3. The constant current flowing through the transistor Q1 as well as through the transistor Q2 with a nearly same value flows through the resistor R5 to the transistor Q7. When the transistor Q7 and the transistors Q8, Q9, and Q10 have elements of the same size, a current equal to the collector current of the transistor Q7 can flow in each collector of the transistors Q8, Q9, and Q10 when a current flows through the transistor Q7. A current having a same value of the sum of the collector currents of the transistors Q8, Q9, and Q10 flows through the transistor Q5. In this case, a current having the same value of that flowing through the transistor Q5 flows through the transistor Q6 as the current $I_D$ serving as an output current if the transistors Q5 and Q6 have elements of the same size. Consequently, the current $I_D$ serving as an output current can be controlled by turning on/off the switches S2 and S3 with signals from the memory circuit 13 since the drain current of the transistor Q5 can be controlled by turning on/off the switches S2 and S3.

As described above, the memory circuit 13 can also control the collector potential of the transistor Tr so as to set the collector potential as an adequate voltage by sending signals to control turning on/off the switches S5 and S6 provided between the base and the collector of the transistor Tr of the oscillation circuit 6.

Newly designing an IC for oscillator needs a huge initial investment. Thus, the IC is required to be mass-produced and applied to a large number of oscillators to drastically reduce the costs. For this reason, a single IC for oscillator should be used for a wide range of frequencies. In related art, a piezoelectric oscillator is designed only for a customer based on parameters determined to meet the customer specification taking into consideration with the oscillation frequency, temperature characteristics, variable frequency range, output voltage, and the like. The related art design method, however, does not satisfy the recent demands of downsizing and low costs so that it is evitable that a circuit excluding a piezoelectric resonator is required to be fabricated as an IC. Thus, when an oscillator for a wide range of frequencies is designed using a single IC for oscillator, the emitter current, collector potential, and the like of the oscillation circuit need to be set as values adequate for the oscillation frequency by using a memory circuit included in the IC. Particularly, an oscillation condition of the oscillation circuit in the operating frequency range, i.e., a negative resistance, is one of the most important design parameters. It is known that a negative resistance is proportional to an emitter current and inversely proportional to the square of an angular frequency. Parameters related to oscillation conditions include the effective resistance of a piezoelectric resonator, capacitances of an oscillation circuit, and the like other than the negative resistance. Generally, as frequency increases, a negative resistance is decreased by the square of the frequency. The emitter current needs to increase so as to cover the reduction.

Figure 2:
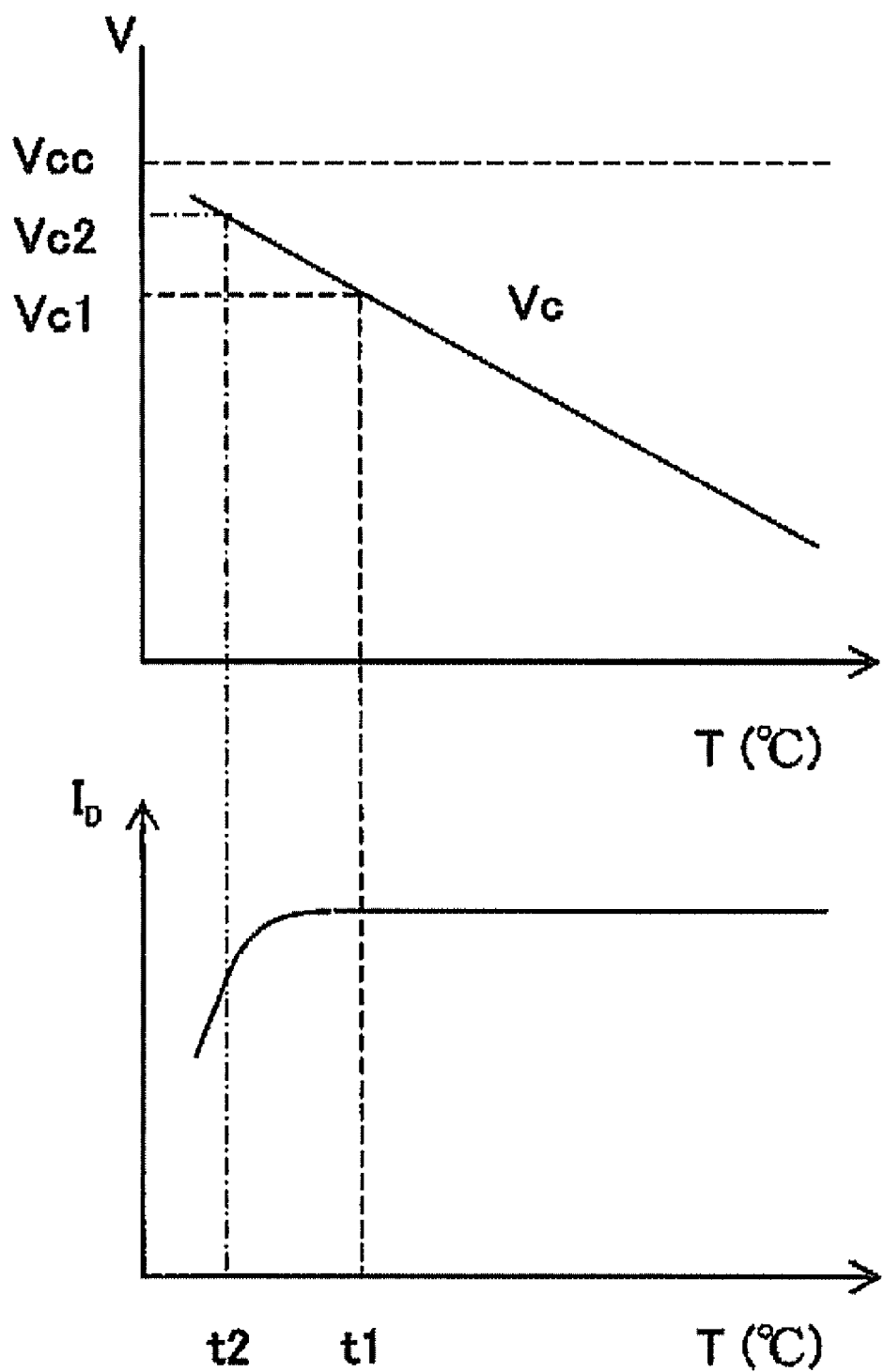
FIG. 2 shows graphs illustrating temperature characteristics of a collector potential Vc of an oscillation circuit and a current ID outputted from a constant current circuit.

FIG. 2 shows graphs illustrating temperature characteristics of the collector potential Vc of the transistor Tr of the oscillation circuit 6 and the current $I_D$ outputted from the constant current circuit 11. At a temperature t1 at which the collector voltage of the transistor Tr is Vc1, the voltage difference between the power source voltage Vcc and the collector voltage Vc1 is enough to secure the voltage between the source and the drain to stably operate the transistor Q6. When temperature decreases to t2, the collector voltage increases to Vc2 due to the temperature characteristic of the transistor Tr. The voltage difference (Vcc−Vc2) is not sufficient to secure the voltage between the source and drain of the transistor Q6, resulting in a saturated condition. As a result, the oscillation circuit shows an unstable operation since the current $I_D$ outputted from the transistors Q5 and Q6 included in the current mirror circuit starts to decrease and the emitter current necessary to maintain the oscillation of the oscillation circuit 6 is not supplied. As a result, the oscillation circuit operates in unstably. Therefore, there arises a need that the collector potential Vc of the transistor Tr of the oscillation circuit 6 is lowered. As shown in FIG. 1, the first variable resistance circuit is connected between the base and the collector of the transistor Tr. The first variable resistance circuit includes the resistor R1, a parallel circuit of the resistor R12 and the switch S5, and a parallel circuit of the resistor R13 and the switch S6. Both parallel circuits are connected in series. Accordingly, the resistance value of the first variable resistance circuit is adjusted by turning on/off the switches S5 and S6 with a signal from the output portion of the memory circuit 13. As a result, the collector potential Vc of the transistor Tr is set such that a drain-source voltage $V_{GS}$ of the transistor Q6 of the current mirror circuit is adequately set.

The feature of the invention is the piezoelectric oscillator adapted so that the output current of the constant current circuit 11 and the collector potential of the transistor Tr of the oscillation circuit 6 are optimally set by signals from the memory circuit 13 included in the IC circuit so as to optimize the oscillation condition, power consumption, noise characteristic, and the like of the oscillation circuit 6 at an oscillation frequency used. While, in the example shown in FIG. 1, the constant current circuit 11 has three switches and the oscillation circuit 6 has two switches and two resistors, the number of switches and resistors may be increased so that the output current and the bias voltage can be more finely set. In addition, a resistor may be interposed between the collector of the transistor Tr of the oscillation circuit 6 and the output of the constant current circuit 11, though the collector and the output are directly connected in FIG. 1.

In the circuit diagram shown in FIG. 1, the first variable resistance circuit and the second variable resistance circuit are independently connected to the output portion of the memory circuit 13 with different signal lines. The first and second variable resistance circuits, however, may be connected so as to operate simultaneously with each other. For example, when the current $I_D$ outputted from the constant current circuit 11 is increased by turning off the switches S2 and S3 in the second variable resistance circuit, the switches S5 and S6 in the first variable resistance circuit may be simultaneously turned off so as to lower the collector potential Vc of the transistor Tr.

Figure 3:
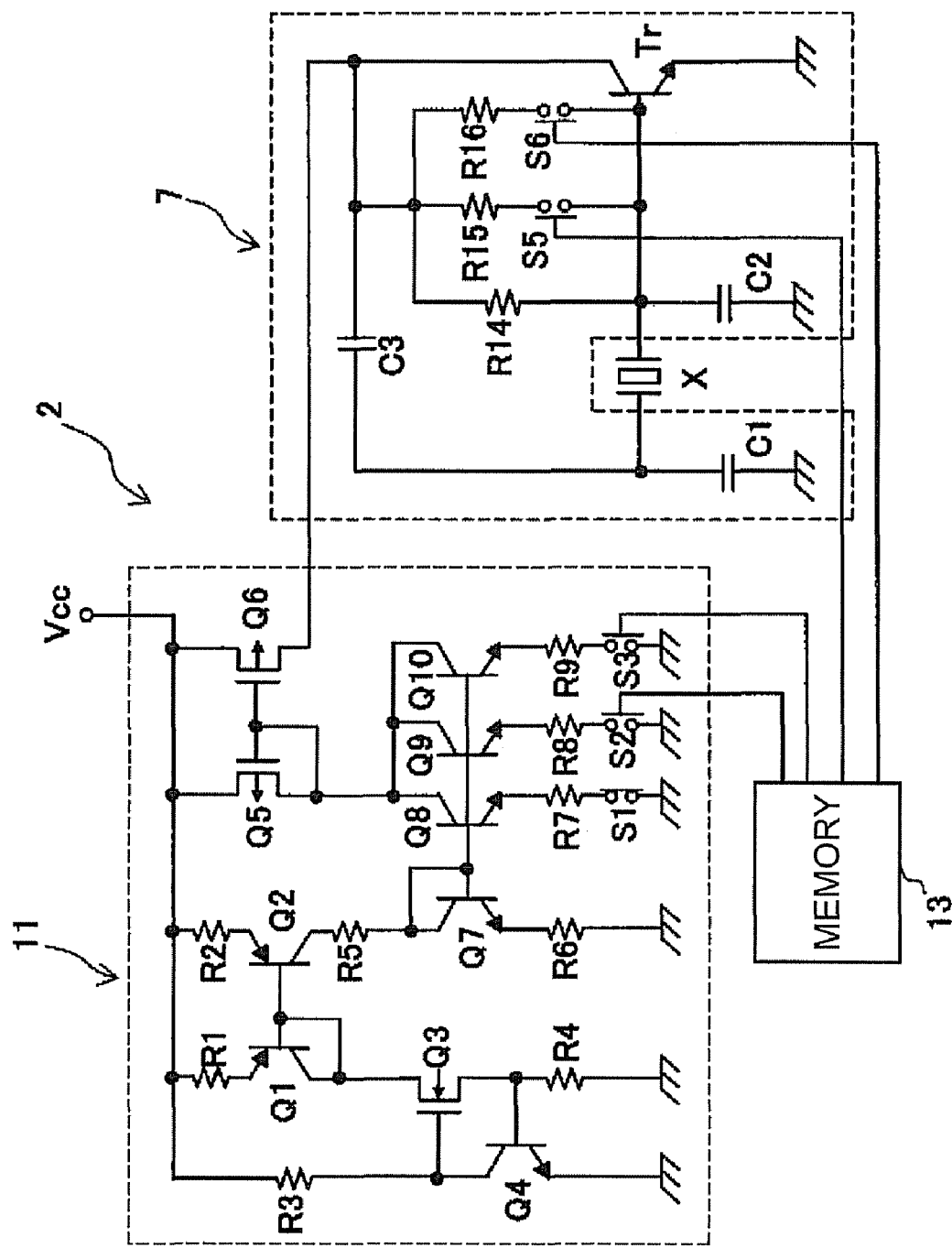
FIG. 3 is a circuit diagram illustrating a structure of a piezoelectric oscillator according to a second embodiment of the invention.

FIG. 3 is a circuit diagram illustrating the structure of a piezoelectric oscillator 2 according to a second embodiment of the invention. FIG. 3 differs from the piezoelectric oscillator 1 shown in FIG. 1 in that the structure of the first variable resistance circuit between the collector and the base of the transistor Tr included in an oscillation circuit 7 is different from that in FIG. 1. As shown in FIG. 3, the first variable resistance circuit includes a plurality of series circuits connected in parallel with each other, each of which is composed of a resistor and a switch. Specifically, a resistor R14, a series circuit of a resistor R15 and the switch S5, and a series circuit of a resistor R16 and the switch S6 are connected parallel. In this case, the collector potential of the transistor Tr also can be set as an adequate potential by varying the resistance value of the first variable resistance circuit with the switches S5 and S6 that are turned on/off by the signals from the output portion of the memory circuit 13.

Figure 4:
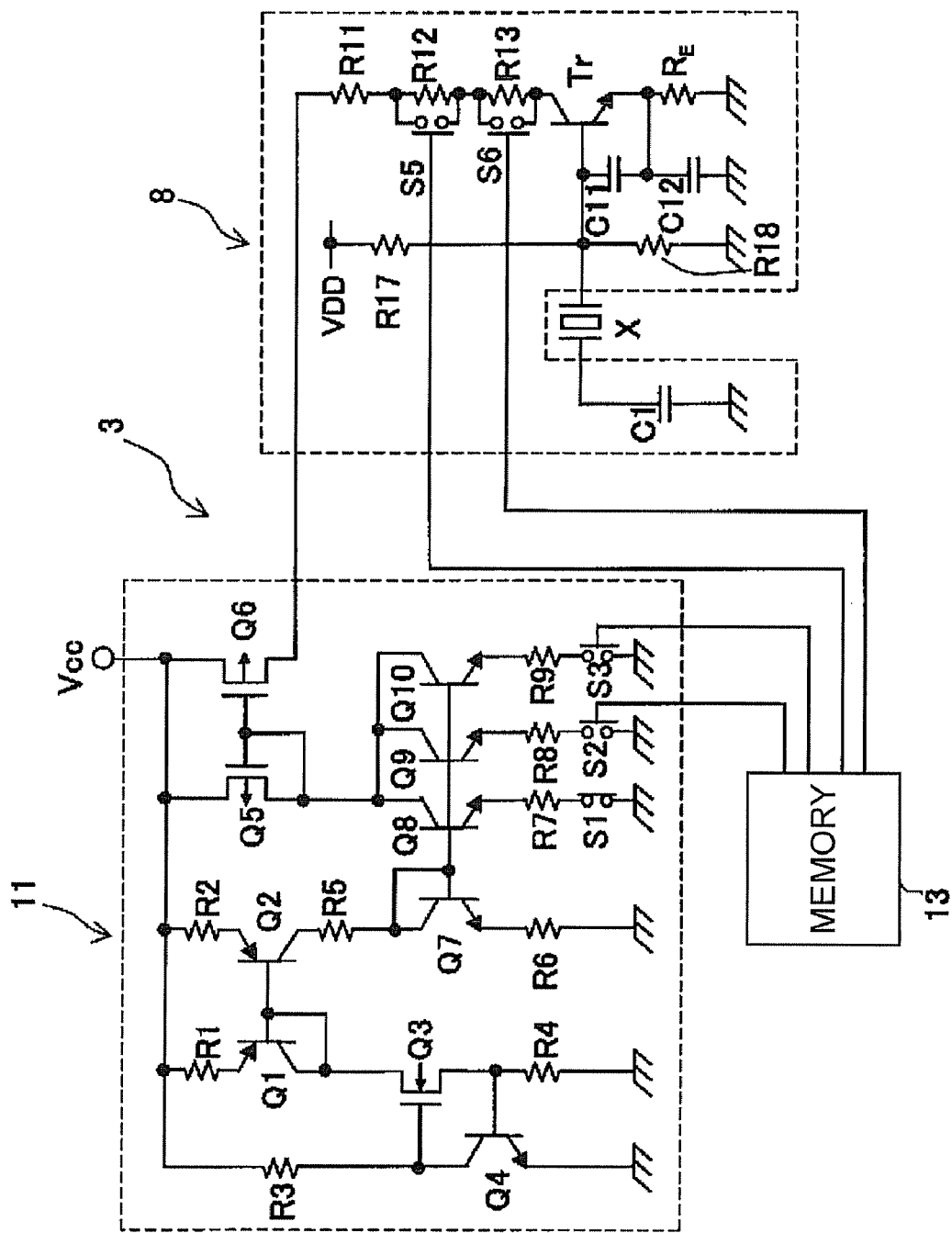
FIG. 4 is a circuit diagram illustrating a structure of a piezoelectric oscillator according to a third embodiment of the invention.

FIG. 4 is a circuit diagram illustrating the structure of a piezoelectric oscillator 3 according to a third embodiment of the invention. FIG. 4 differs from the piezoelectric oscillator 1 shown in FIG. 1 in that an oscillation circuit 8 is a Colpitts oscillation circuit. In the Colpitts oscillation circuit, the collector of the transistor Tr is connected to the constant current circuit 11 with the first variable resistance circuit interposed therebetween, and a resistor R17 is connected between the base of the transistor Tr and a power source VDD so as to bias the base voltage. The capacitor C1 is connected between the base and the emitter of the transistor Tr. A parallel circuit of an emitter resistor RE and the capacitor C2 is connected between the emitter and the ground. The oscillation output (not shown) is taken out from the collector of the transistor Tr through a capacitor Co. Here, the power source voltage Vcc is grounded in a high-frequency manner through a bypass capacitor (not shown).

The first variable resistance circuit is composed of the resistor R11, a parallel circuit of the resistor R12 and the switch S5, and a parallel circuit of the resistor R13 and the switch S6. The resistor R11 and the parallel circuits are connected in series. The switches S5 and S6 are connected to the output portion of the memory circuit 13 with respective signal lines. The collector potential Vc of the transistor Tr can be set as an adequate potential by varying the resistance value of the first variable resistance circuit with the switches S5 and S6 that are turned on/off by the signals from the output portion of the memory circuit 13.

Figure 5:
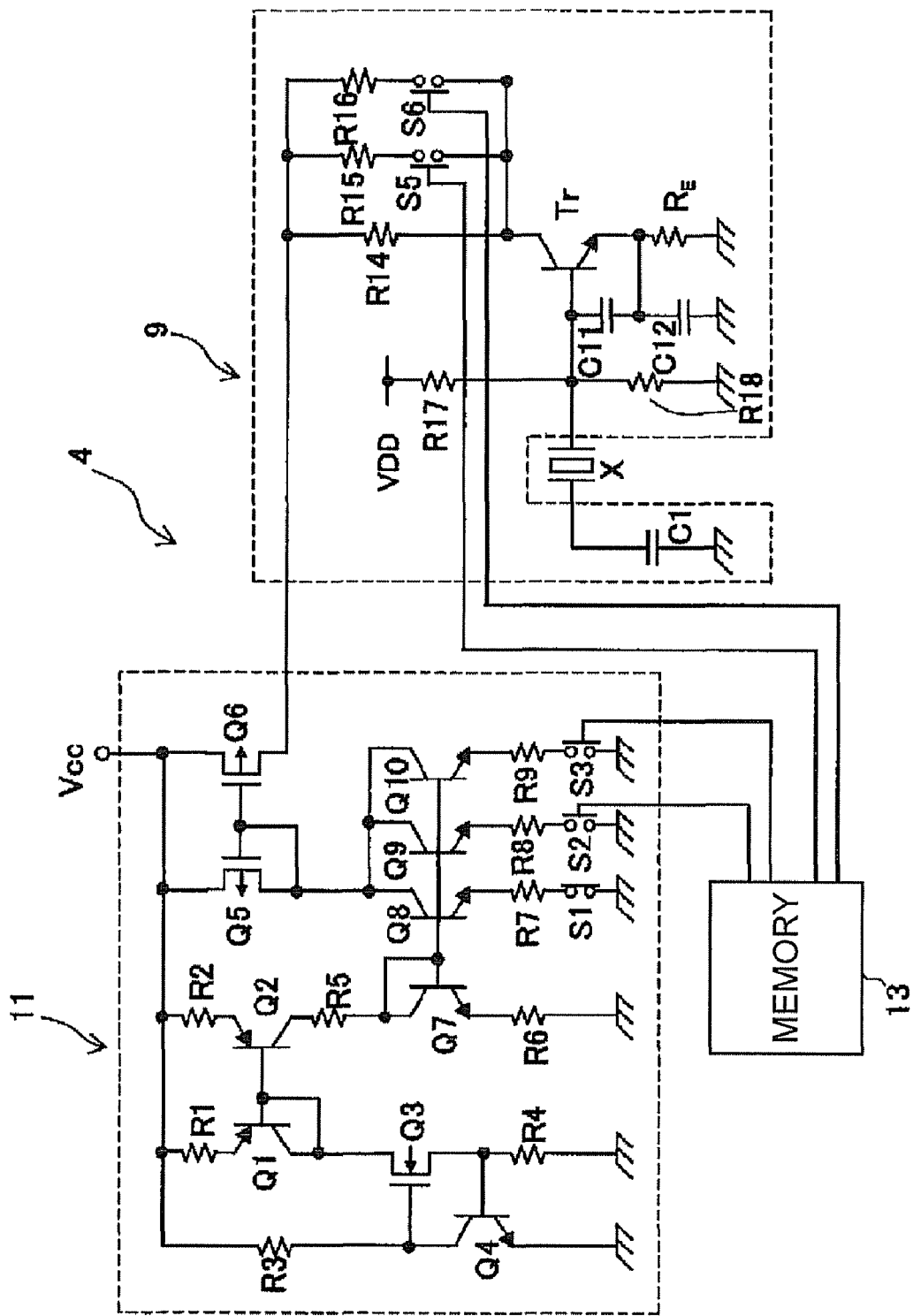
FIG. 5 is a circuit diagram illustrating a structure of a piezoelectric oscillator according to a fourth embodiment of the invention.
Figure 6:
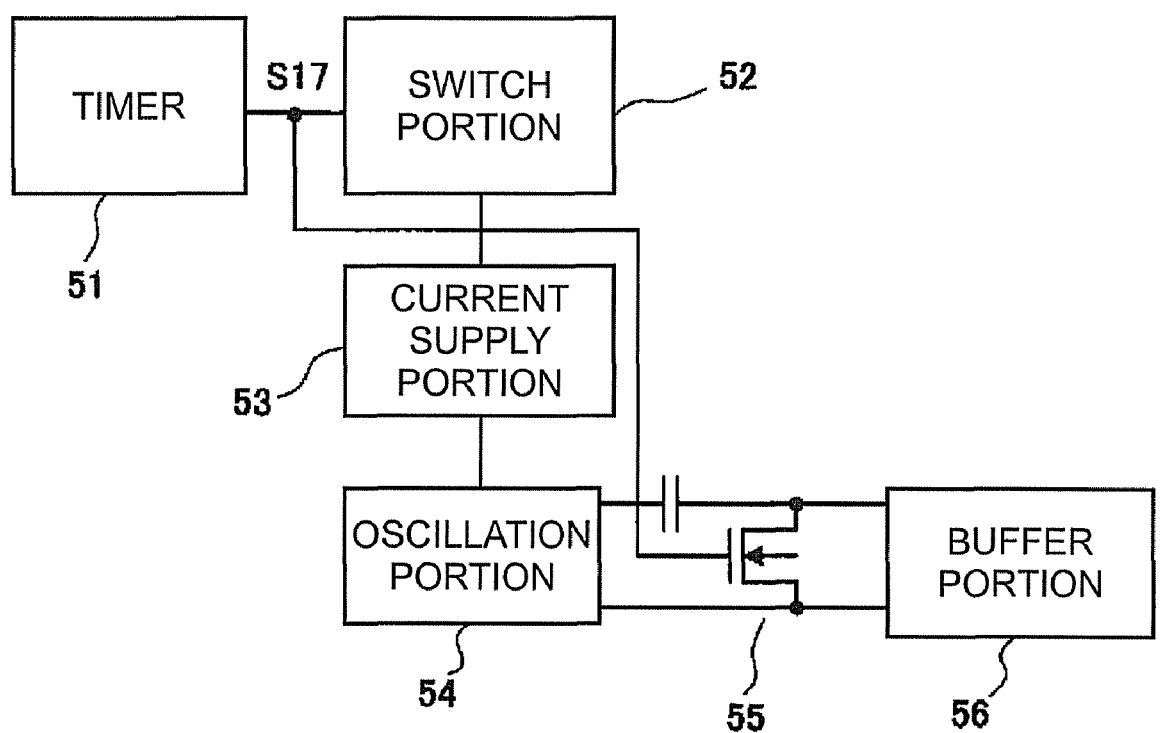
FIG. 6 is a circuit diagram illustrating a structure of a related art circuit.

FIG. 5 is a circuit diagram illustrating the structure of a piezoelectric oscillator 4 according to a fourth embodiment of the invention. FIG. 5 differs from the piezoelectric oscillator 2 shown in FIG. 3 in that an oscillation circuit 9 is the Colpitts oscillation circuit. The first variable resistance circuit is adapted such that the resistor R14, a series circuit of the resistor R15 and the switch S5, and a series circuit of the resistor R16 and the switch S6 are connected parallel. The switches S5 and S6 are connected to the output portion of the memory circuit 13 with signal lines. The collector potential Vc of the transistor Tr can be set as an adequate potential by varying the resistance value of the first variable resistance circuit with the switches S5 and S6 that are turned on/off by the signals from the output portion of the memory circuit 13.

The entire disclosure of Japanese Patent Application No. 2007-292859, filed Nov. 12, 2007 is expressly incorporated by reference herein.

What is claimed is:

1. A piezoelectric oscillator, comprising:
   a piezoelectric resonator;
   an oscillation circuit including a variable resistance circuit and a first transistor for oscillation;
   a constant current circuit, the constant current circuit including a first current mirror circuit having an output terminal, and a current control circuit controlling a current flowing in the first current mirror circuit so as to enable an output current of the constant current circuit to be adjusted, the output terminal of the first current mirror circuit being coupled to at least one of a first terminal and a control terminal of the first transistor; and
   a control circuit coupled to the current control circuit and the variable resistance circuit, the control circuit controlling the current control circuit and a resistance value of the variable resistance circuit, wherein:
   the control circuit includes a switch circuit,
   the constant current circuit further includes a constant current source,
   the current control circuit is configured as a second current mirror circuit including a second transistor receiving an output current of the constant current source, and a plurality of mirror transistors coupling to the second transistor as a current mirror connection,
   the plurality of mirror transistors are coupled parallel each other and coupled to the first current mirror circuit, and
   the switch circuit is provided between a reference potential and second terminals of each of the plurality of mirror transistors.

2. The piezoelectric oscillator according to claim 1, wherein the oscillation circuit is configured as a Pierce oscillation circuit.

3. The piezoelectric oscillator according to claim 1, wherein the oscillation circuit is configured as a Colpitts oscillation circuit.

4. The piezoelectric oscillator according to claim 1, wherein the variable resistance circuit includes a plurality of parallel-connected circuits coupled in series, each of the plurality of parallel-connected circuits including a resistor and a switch that are coupled in parallel.

5. The piezoelectric oscillator according to claim 1, wherein the variable resistance circuit includes a plurality of series-connected circuits coupled in parallel, each of the plurality of series-connected circuits including a resistor and a switch that are coupled in series.

6. The piezoelectric oscillator according to claim 1, wherein the switch circuit includes a plurality of circuits each having a resistor and a switch coupled in series with the resistor, each of the plurality of circuits coupling to one of the plurality of mirror transistors.

7. The piezoelectric oscillator according to claim 1, further comprising a circuit portion that is fabricated as an integrated circuit, the circuit portion including the oscillation circuit, the constant current circuit, and the control circuit, and excluding the piezoelectric resonator.

8. The piezoelectric oscillator according to claim 1, wherein the variable resistance circuit is coupled between the first terminal of the first transistor and the control terminal of the first transistor.

* * * * *